(12) United States Patent
Yamazaki et al.

(10) Patent No.: US 9,157,805 B2
(45) Date of Patent: Oct. 13, 2015

(54) INFRARED RAY SENSOR PACKAGE, INFRARED RAY SENSOR MODULE, AND ELECTRONIC DEVICE

(71) Applicant: NEC CORPORATION, Minato-ku, Tokyo (JP)

(72) Inventors: Takao Yamazaki, Minato-ku (JP); Seiji Kurashina, Minato-ku (JP)

(73) Assignee: NEC CORPORATION, Tokyo (JP)

( * ) Notice: Subject to any disclaimer, the term of this patent is extended or adjusted under 35 U.S.C. 154(b) by 156 days.

(21) Appl. No.: 13/845,897

(22) Filed: Mar. 18, 2013

(65) Prior Publication Data

US 2013/0306868 A1 Nov. 21, 2013

(30) Foreign Application Priority Data

Apr. 13, 2012 (JP) ................. 2012-091535

(51) Int. Cl.
*G01J 5/04* (2006.01)
*G01J 5/06* (2006.01)

(52) U.S. Cl.
CPC ................. *G01J 5/045* (2013.01); *G01J 5/048* (2013.01); *G01J 5/061* (2013.01); *H01L 2224/48091* (2013.01)

(58) Field of Classification Search
CPC .................................. G01J 5/045; G01J 5/048
USPC .......... 250/338.1, 352; 257/680, 682; 438/57, 438/58, 106, 116
See application file for complete search history.

(56) References Cited

U.S. PATENT DOCUMENTS

| | | | | |
|---|---|---|---|---|
| 7,470,904 | B1* | 12/2008 | Schweikert et al. | 250/338.1 |
| 2005/0253283 | A1* | 11/2005 | DCamp et al. | 257/787 |
| 2010/0314544 | A1* | 12/2010 | Ouvrier-Buffet | 250/338.4 |

FOREIGN PATENT DOCUMENTS

JP   2006250707   *   9/2006   ................ G01J 1/02

* cited by examiner

*Primary Examiner* — David Porta
*Assistant Examiner* — Meenakshi Sahu
(74) *Attorney, Agent, or Firm* — Sughrue Mion, PLLC (57) ABSTRACT

According to the present invention, the gas adsorption capability of a getter can be maintained while the characteristics of an infrared ray sensor element are prevented from being deteriorated. An infrared ray sensor package has an infrared ray sensor element, a base substrate, a housing, an infrared ray transmission window, and a getter. The infrared ray sensor element is vacuum-sealed in a space surrounded by the base substrate, the housing, and the infrared ray transmission window. A spacer is disposed between the infrared ray sensor element and the base substrate to form a gap between the infrared ray sensor element and the base substrate. The getter is arranged in the gap formed between the infrared ray sensor element and the base substrate. A heat shielding member is disposed between the infrared ray sensor element and the getter. The heat shielding member is a heater for heating the infrared ray sensor element or an element formed of alloy containing Ni or heat-resistant glass.

17 Claims, 7 Drawing Sheets

INFRARED RAY SENSOR PACKAGE, INFRARED RAY SENSOR MODULE, AND ELECTRONIC DEVICE

This application is based upon and claims the benefit of priority from Japanese patent application No. 2012-091535, filed on Apr. 13, 2012, the disclosure of which is incorporated herein in its entirety by reference.

BACKGROUND

The present invention relates to an infrared ray sensor package, an infrared ray sensor module, and an electronic device.

In recent years, size reduction, functional enhancement, and cost reduction have been demanded in an infrared ray sensor package having a vacuum-sealed infrared ray sensor element or in an electronic device having such an infrared ray sensor package.

Generally, infrared ray sensor elements (infrared detection elements) include thermal infrared detectors and photonic infrared detectors. Thermal infrared detectors are inferior to photonic infrared detectors in tracking capability. However, thermal infrared detectors detect the quantity of heat in a relative manner and may thus need no cooling mechanism. Therefore, the structure of an infrared ray sensor element can be simplified, so that the cost of manufacturing an infrared ray sensor element can be reduced.

Figure 8A:
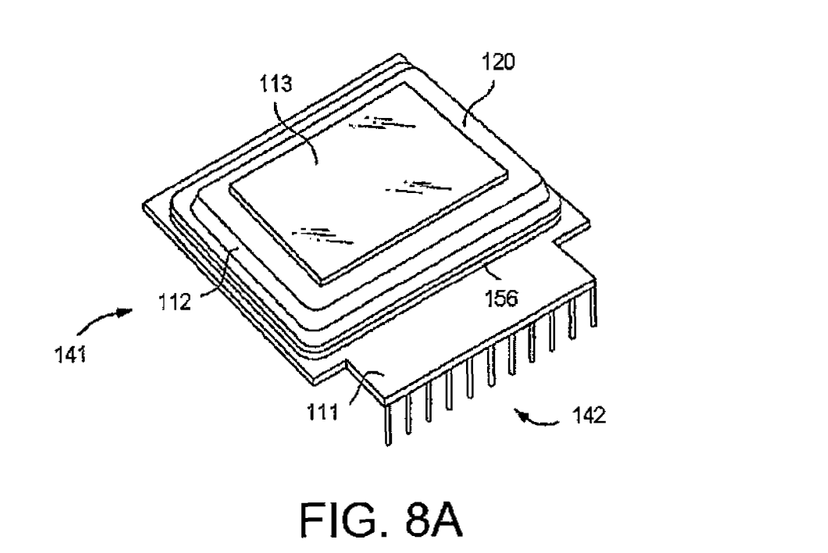
FIG. 8A is a diagram showing an appearance of a conventional infrared ray sensor package.
Figure 8B:
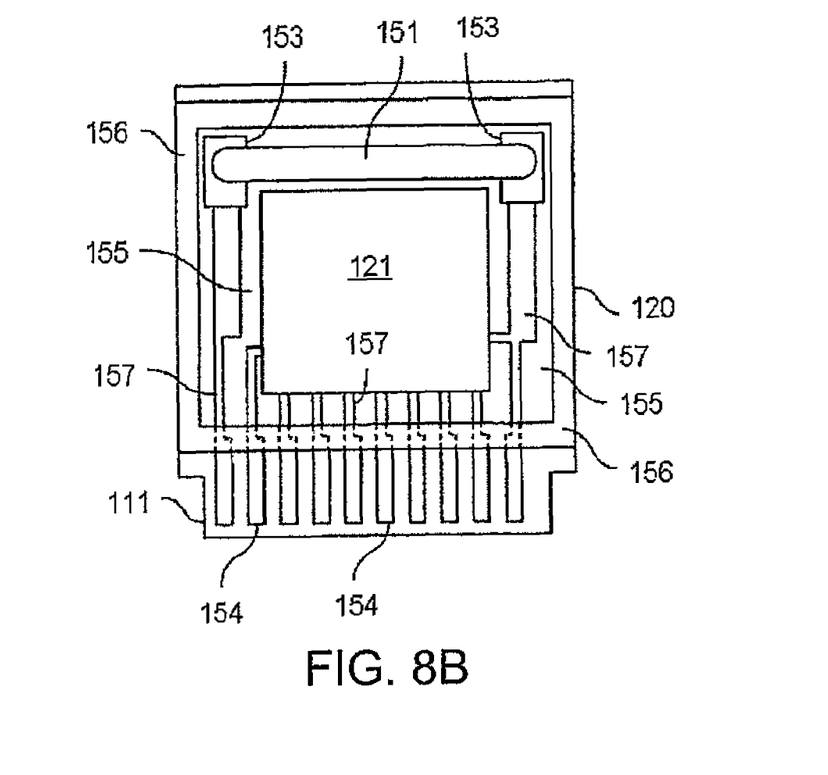
FIG. 8B is a view visualizing an interior of the conventional infrared ray sensor package.

As a conventional thermal infrared ray sensor package having no cooling mechanism, there has been known an infrared ray sensor package 141 as illustrated in FIGS. 8A and 8B (see, e.g., U.S. Pat. No. 7,470,904).

As shown in FIGS. 8A and 8B, the conventional infrared ray sensor package 141 includes an infrared ray sensor element 121, a lower housing 111, an upper housing 112, metal patterns 154, 155, and 157 formed on the lower housing 111, an infrared ray transmission window 113 joined to the upper housing 112, a seal ring 156 connecting the lower housing 111 and the upper housing 112 to each other, contact pins 142 serving as external output terminals of the infrared ray sensor package, a getter 151, and Kovar blocks 153 provided on the lower housing 111. The lower housing 111 and the upper housing 112 form a container 120. The getter 151 is mounted on the Kovar blocks 153.

In an infrared ray sensor package having a vacuum-sealed infrared ray sensor element, a trace amount of gas such as moisture, oxygen, and hydrogen is emitted from an inner surface of the package with time. Such emitted gas deteriorates the degree of vacuum after the vacuum sealing. In order to prevent this phenomenon, what is called a getter is provided within an infrared ray sensor package. The getter has a function of adsorbing the emitted gas (oxygen, carbon monoxide, moisture, carbon dioxide, nitrogen, hydrogen, and the like) to prevent deterioration of the degree of vacuum.

Generally, in order to maintain the gas adsorption capability of a getter, it is necessary to heat the getter at certain temperatures (about 400° C. to 500° C. at maximum). However, the infrared ray sensor element 121 is located adjacent to the getter 151 in the conventional infrared ray sensor package 141. Therefore, heat radiated from the getter 151 is transferred to the infrared ray sensor element 121 when the getter 151 is heated. Thus, the characteristics of the infrared ray sensor element 121 are problematically deteriorated.

SUMMARY

The present invention has been made in order to solve the problems in the prior art. It is, therefore, an object of the present invention to provide an infrared ray sensor package that can maintain the gas adsorption capability of a getter while characteristics of an infrared ray sensor element are prevented from being deteriorated, an infrared ray sensor module having such an infrared ray sensor package, and an electronic device having such an infrared ray sensor package.

According to a first aspect of the present invention, there in provided an infrared ray sensor package having an infrared ray sensor element, a base substrate portion electrically connected to the infrared ray sensor element, a housing portion surrounding the infrared ray sensor element, and an infrared ray transmission window. The infrared ray sensor element is vacuum-sealed in a space surrounded by the base substrate portion, the housing portion, and the infrared ray transmission window. The infrared ray sensor package also has a spacer disposed between the infrared ray sensor element and the base substrate portion to form a gap between the infrared ray sensor element and the base substrate portion, a getter arranged in the gap, and a heat shielding member disposed between the infrared ray sensor element and the getter. The heat shielding member is a heater for heating the infrared ray sensor element or an element formed of alloy containing Ni or heat-resistant glass. With this configuration, the aforementioned problems are solved.

According to a second aspect of the present invention, there is provided an infrared ray sensor module having the aforementioned infrared ray sensor package and a driver circuit electrically connected to the infrared ray sensor package. The driver circuit is operable to drive the infrared ray sensor package. With this configuration, the aforementioned problems are solved.

According to a third aspect of the present invention, there is provided an electronic device having the aforementioned infrared ray sensor package or infrared ray sensor module. With this configuration, the aforementioned problems are solved.

According to the present invention, a heat shielding member is disposed between the infrared ray sensor element and the getter. Therefore, radiant heat generated upon heating the getter is prevented from being transferred to the infrared ray sensor element. Accordingly, the characteristics of the infrared ray sensor element are prevented from being deteriorated. At the same time, the getter can be heated and activated in a state in which the gas adsorption capability of the getter is maintained.

Furthermore, a heater is formed of a heat-resisting material by nature. Therefore, when a heater is used as the heat shielding member, the heater can have a heating function of holding the infrared ray sensor element at a constant temperature and a heat shielding function of preventing radiant heat of the getter, which has a temperature higher than a proper temperature of the infrared ray sensor element, from being transferred to the infrared ray sensor element. Therefore, deterioration of the characteristics of the infrared ray sensor element due to the radiant heat from the getter can reliably be prevented without increasing the number of parts or the manufacturing cost.

Furthermore, since a glass material or an alloy material containing Ni hardly emits a gas by itself, there is almost no risk that the degree of vacuum would be deteriorated in the long term. Therefore, it is possible to achieve an infrared ray sensor package that can exhibit high performance with high reliability.

Moreover, alloy containing Ni or heat-resisting glass that constitutes the heat shielding member has a low heat conductivity. Therefore, radiant heat generated upon heating the getter is unlikely to be transferred to the infrared ray sensor element even if the heat is adsorbed into the heat shielding member in a case where the infrared ray sensor element and the heat shielding member are arranged close to each other. Accordingly, the characteristics of the infrared ray sensor element can be prevented from being deteriorated.

DETAILED DESCRIPTION OF THE PREFERRED EMBODIMENTS

Several embodiments of an infrared ray sensor package according to the present invention will be described below with reference to FIGS. 1A to 7B.

First Embodiment

An infrared ray sensor package 17 according to a first embodiment of the present invention will be described below with reference to FIGS. 1A to 1E.

Figure 1A:
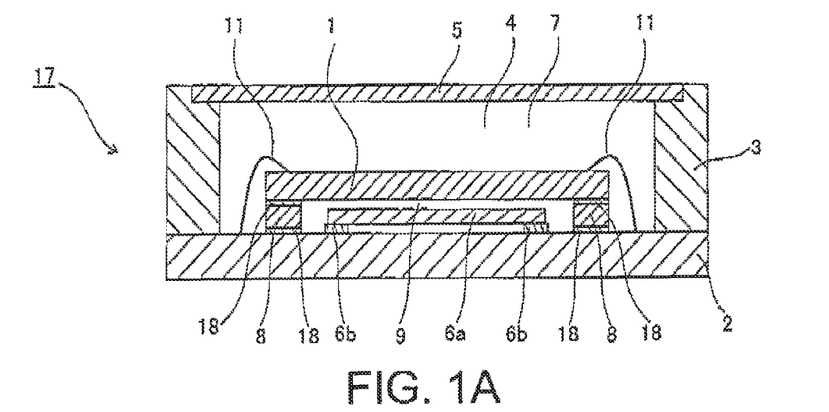
FIG. 1A is a cross-sectional view schematically showing a basic structure of an infrared ray sensor package according to a first embodiment of the present invention.

As shown in FIG. 1A, the infrared ray sensor package 17 according to the first embodiment of the present invention includes an infrared ray sensor element 1, a base substrate 2 electrically connected to the infrared ray sensor element 1, a housing 3 surrounding the infrared ray sensor element 1, an infrared ray transmission window 5 covering a through hole 4 formed in a portion of the housing 3, and a getter 6a.

The infrared ray sensor element 1 is vacuum-sealed within a space 7 surrounded by the base substrate 2, the housing 3, and the infrared ray transmission window 5. A spacer material 8 is inserted between the infrared ray sensor element 1 and the base substrate 2 to form a gap 9 between the infrared ray sensor element 1 and the base substrate 2. The getter 6a is mounted in the gap 9 between the infrared ray sensor element 1 and the base substrate 2. The getter 6a is electrically connected to terminals 6b formed on the base substrate 2.

The material of the getter 6a is not limited to a specific one. Nevertheless, it is preferable to use, as a material for the getter 6a, a Zr-based material, a Ti-based material, or an alloy containing those materials.

The method of connecting external terminals (not shown) formed on a surface of the infrared ray sensor element 1 to the base substrate 2 is not limited to a specific one. For example, as shown in FIG. 1A, those external terminals may electrically be connected to the base substrate 2 via conductive wires 11. The material of the wires 11 is not limited to a specific one. Nevertheless, it is preferable to use, as a material for the wires 11, a conductive material having a high electric conductivity, such as Al, Al alloy, or Au. Alternatively, the infrared ray sensor element 1 may electrically be connected to the base substrate 2 by using tape-automated bonding (TAB) technology.

The spacer material 8 is not limited to a specific one. Nevertheless, it is preferable to use, as the spacer material 8, heat-resistant glass or metal that can bear (or is not deformed by) heat radiated from the getter 6a, which is located near the spacer material 8, when the getter 6a is heated. The getter 6a is heated by supplying a current to the getter 6a from external terminals of the infrared ray sensor package 17 (not shown in FIG. 1A) via the terminals 6b on the base substrate 2.

It is preferable to use, as the base substrate 2, a wiring board having a base material of a ceramic material, such as glass ceramic or alumina, or Si. Such a base material has a low coefficient of linear expansion (about 3 ppm to about 4 ppm). Thus, differences in coefficient of linear expansion are small between the base substrate 2 and the infrared ray sensor element 1, which generally has a sensor element formed on a Si substrate. As a result, the package can achieve high reliability for a long period of time. Furthermore, when the aforementioned material is used for the base substrate 2, less outgassing is caused from the base substrate 2 as compared to a case where a resin material is used for the base substrate 2. Therefore, the degree of vacuum is advantageously prevented from being deteriorated after production of a vacuum-sealed package.

The material of the housing 3 preferably includes a structure produced by using an alloy material including at least Ni, such as Kovar or Alloy 42. The alloy material including at least Ni, such as Kovar or Alloy 42, has a low coefficient of linear expansion (about 3 ppm to about 4 ppm). Therefore, the package can achieve high reliability for a long period of time. Furthermore, since the alloy material including at least Ni, such as Kovar or Alloy 42, is a magnetic material, it exhibits magnetic shielding effects. As a result, the infrared ray sensor element 1 is not subjected to electromagnetic interference from other electronic devices located outside of the structure sealing the infrared ray sensor element 1. Therefore, the infrared ray sensor package 17 can perform a stable operation. Moreover, since the alloy material is metallic and electrically conductive, electroplating (electrolytic plating), which can form a thicker metal layer in a shorter period time at a lower cost as compared to a sputtering method or a deposition method, can be used to form a different type of metal layer (metal film) than the alloy material on a surface of the alloy material.

It is preferable to use, as a material for the infrared ray transmission window 5, an alkali halide material and an alkaline earth halide material such as LiF, NaCl, KBr, CsI, $CaF_2$, $BaF_2$, and $MgF_2$, and chalcogenide glass primarily containing Ge, As, Se, Te, Sb, or the like, as well as Si, Ge, ZnS, ZnSe, $Al_2O_3$, $SiO_2$, and the like, in order to allow an infrared ray to pass through the infrared ray transmission window 5.

The method of evacuating the interior of the infrared ray sensor package 17 is not limited to a specific one. As an example, the getter 6a is welded to the terminals 6b on the base substrate 2, and then the spacer material 8 is bonded to the base substrate 2 by using an adhesive agent 18. The infrared ray sensor element 1 is bonded to an upper surface of the spacer material 8 by using an adhesive agent 18. Thereafter, the infrared ray sensor element 1 is electrically connected to the terminals (not shown in FIG. 1A) formed on the base substrate 2 by wires 11. A periphery of the base substrate 2 is joined under vacuum to the housing 3 with which the infrared ray transmission window 5 has been incorporated. Thus, the interior of the infrared ray sensor package 17 is vacuum-sealed.

The method of joining the base substrate 2 and the housing 3 to each other is not limited to a specific one. Furthermore, the method of joining the housing 3 and the infrared ray transmission window 5 to each other is not limited to a specific one. For example, a brazing filler material such as a solder material (Sn, Pb, SnPb, SnAg, SnCu, SnAgCu, SnIn, SnZn, SnBi, SnZnBi, Bi, In, or InAg) is formed at joining portions of the base substrate 2, the housing 3, and the infrared ray transmission window 5, and then heated and melted so that those components are welded to each other. Alternatively, those components may be joined to each other by using a surface activated bonding method, a thermocompression bonding method, an ultrasonic bonding method, an anodic bonding method, or the like.

The method of vacuum-sealing the interior of the infrared ray sensor package 17 is not limited to a method of using the housing 3 with which the infrared ray transmission window 5 has been incorporated. The housing 3 and the infrared ray transmission window 5 may be joined to each other under vacuum after a periphery of the base substrate 2 has been joined to the housing 3. In such a case, it is not necessary to join the base substrate 2 and the housing 3 to each other under vacuum. The base substrate 2 and the housing 3 may be joined to each other in the air or in a nitrogen atmosphere. When the base substrate 2 and the housing 3 are not joined to each other under vacuum, they may be joined to each other by heating and melting a brazing filler material with a reflow furnace or a hot plate in a nitrogen atmosphere. When the base substrate 2 and the housing 3 are joined to each other in a nitrogen atmosphere, the wettability of a brazing filler material becomes favorable, and oxidation of the brazing filler material can be suppressed. Thus, highly reliable joining can be achieved. Furthermore, a brazing filler material may be heated and melted for joining without a reflow furnace or a hot plate by laser welding in the air or in a nitrogen atmosphere. The laser welding is a process of locally heating a periphery of a brazing filler material for a short period of time to melt the brazing filler material for joining. Thus, the laser welding does not need to heat the whole structure including the infrared ray sensor element 1, unlike joining using a reflow furnace. Therefore, no thermal damage is caused to the infrared ray sensor element 1. Accordingly, the characteristics of the infrared ray sensor package 17 are less deteriorated, and the long-term reliability of the infrared ray sensor package 17 can be made high. When SnAg solder, which has a melting point of about 220° C., is used as the brazing filler material, the peak temperature of a reflow furnace or a hot plate should be increased to about 260° C. Therefore, the characteristics of the infrared ray sensor element 1 may be deteriorated by temperature history of such high temperatures. Even if the characteristics of the infrared ray sensor element 1 are not deteriorated by temperature history of such high temperatures, the long-term reliability of the infrared ray sensor package 17 may be lowered.

The method of producing a vacuum-sealed space is not limited to a specific one. As an example, a sample in which the infrared ray sensor element 1, the spacer material 8, and the base substrate 2 with the getter 6a are bonded to each other is disposed within a vacuum chamber. The vacuum chamber is evacuated to a required ultimate vacuum. Generally, the vacuum chamber is evacuated to 1 Pa or less, at which the infrared ray sensor element 1 can exhibit at least the minimum performance. Preferably, the vacuum chamber is evacuated to $10^{-4}$ Pa or less because the vacuum chamber can be held at 1 Pa or less, at which the infrared ray sensor element 1 can exhibit the minimum performance, even if the degree of vacuum is lowered with time. Then the sample and a structure in which the housing 3 and the infrared ray transmission window 5 have been incorporated with each other are stacked in the vacuum chamber and joined to each other. Thus, the interior of the infrared ray sensor package 17 is vacuum-sealed.

Alternatively, a sample in which the housing 3 has been bonded or joined to the structure of the infrared ray sensor element 1, the spacer material 8, and the base substrate 2 with the getter 6a is disposed within a vacuum chamber. The vacuum chamber is evacuated to a required ultimate vacuum, and then the sample and the infrared ray transmission window 5 are stacked in the vacuum chamber and joined to each other. Thus, the interior of the infrared ray sensor package 17 is vacuum-sealed.

In the first embodiment and the following embodiments described later, no copper pipe (discharge pipe) for evacuation is provided on the infrared ray sensor package 17. As a matter of course, a through hole may be formed in the base substrate 2, and a discharge pipe may be joined to the base substrate 2 so that the discharge pipe continuously extends from the through hole. The discharge pipe is connected to a vacuum pump. The interior of the infrared ray sensor package 17 is evacuated to a required ultimate vacuum, and then the discharge pipe is caulked by an external mechanical force so that the interior of the infrared ray sensor package 17 is sealed. In other words, metal of the discharge pipe, such as copper, is squashed by pressure so that the interior of the infrared ray sensor package 17 is sealed.

The locations at which the external terminals of the infrared ray sensor package 17 are formed are not illustrated in FIG. 1A of the first embodiment or other drawings of the following embodiments, and are not limited to specific locations. The external terminals of the infrared ray sensor package 17 may be formed at any locations, such as a side surface of the infrared ray sensor package 17 (a surface perpendicular to the base substrate 2) or a surface of the infrared ray sensor package 17 that is opposite to a surface on which the infrared ray transmission window 5 is mounted.

Furthermore, the external terminals of the infrared ray sensor package 17 are not limited to specific forms. The external terminals of the infrared ray sensor package 17 may have any specific form.

Figure 1B:
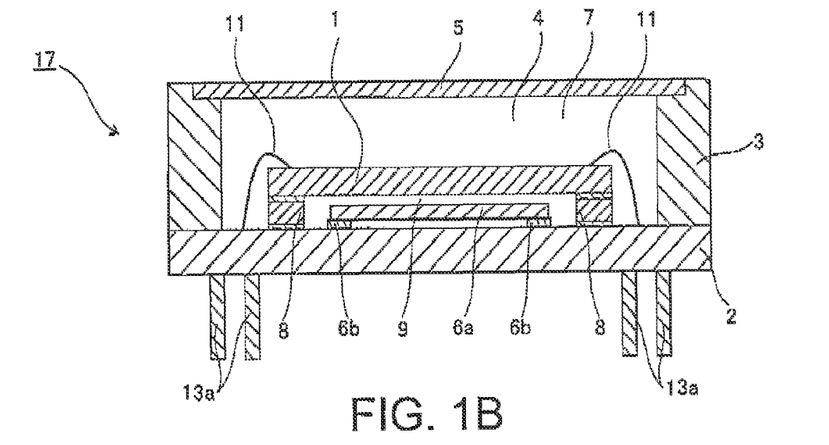
FIG. 1B is a cross-sectional view showing an example using conductive pins as external terminals.

For example, one of examples of the external terminals of the infrared ray sensor package 17 is illustrated in FIG. 1B. The external terminals illustrated in FIG. 1B comprise conductive pins 13a formed on a surface of the base substrate 2 that is opposite to a surface on which the infrared ray sensor element 1 is mounted. The conductive pins 13a are electrically connected to the infrared ray sensor element 1 and the base substrate 2. Such conductive pins 13a are referred to as pin grid array (PGA) external terminals.

Figure 1C:
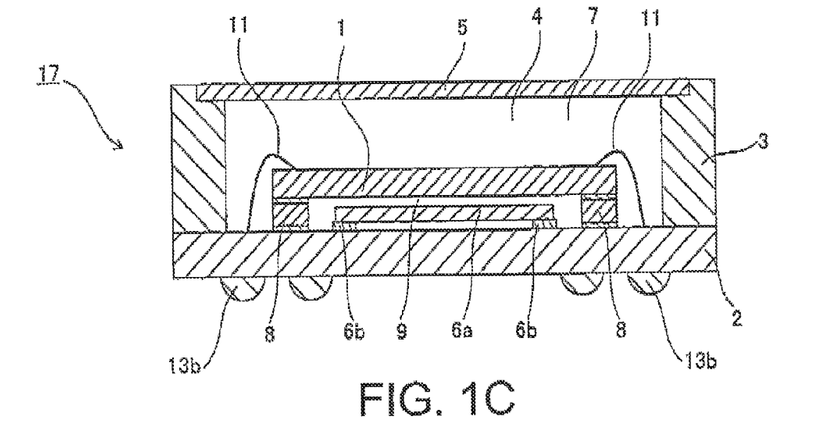
FIG. 1C is a cross-sectional view showing an example using conductive balls as external terminals.

Another example of the external terminals of the infrared ray sensor package 17 is illustrated in FIG. 1C. The external terminals illustrated in FIG. 1C comprise conductive balls 13b formed on the surface of the base substrate 2 that is opposite to the surface on which the infrared ray sensor element 1 is mounted. The conductive balls 13b are electrically connected to the infrared ray sensor element 1 and the base substrate 2. Such conductive balls 13b are referred to as ball grid array (BGA) external terminals.

Figure 1D:
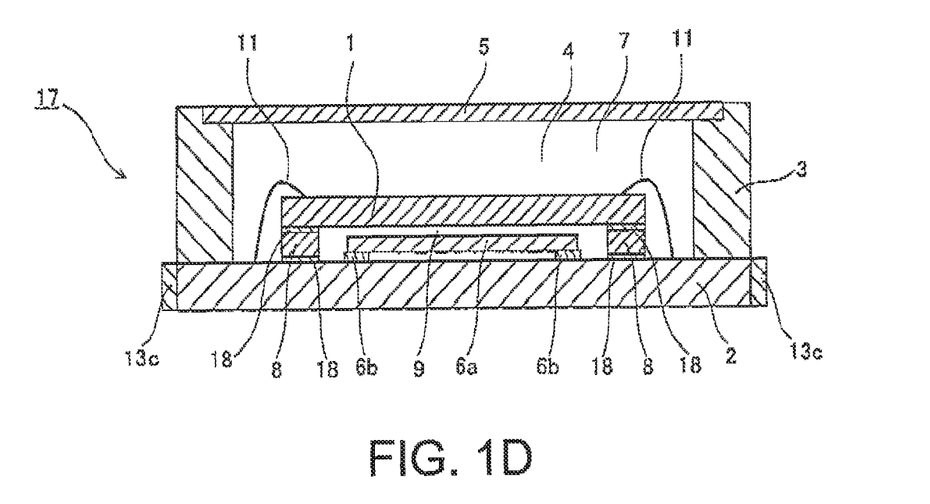
FIG. 1D is a cross-sectional view showing an example including conductive terminals formed as external terminals on side surfaces of a base substrate.

Still another example of the external terminals of the infrared ray sensor package 17 is illustrated in FIG. 1D. The external terminals of the infrared ray sensor package 17 as illustrated in FIG. 1D comprise conductive terminals 13c formed on side surfaces of the base substrate 2. The conductive terminals 13c are electrically connected to the infrared ray sensor element 1 and the base substrate 2. Such conductive terminals 13c are referred to as land grid array (LGA) external terminals.

Figure 1E:
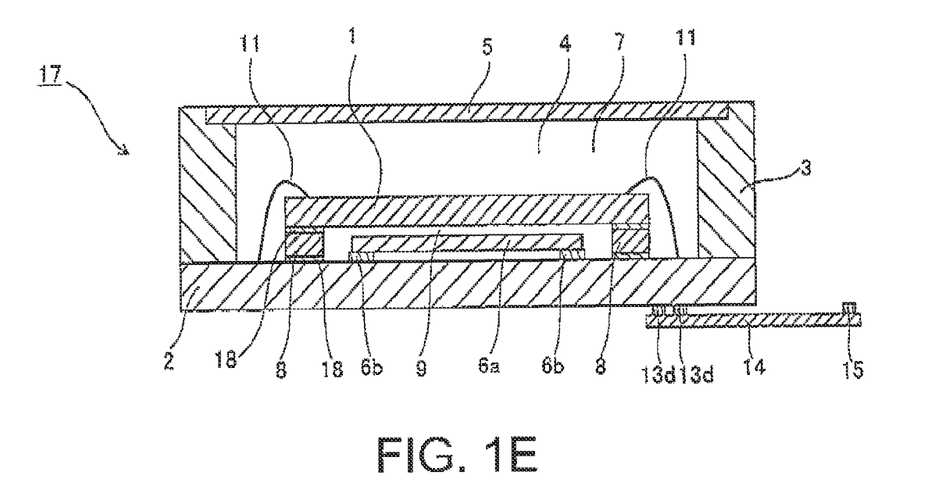
FIG. 1E is a cross-sectional view showing an example using a flexible circuit board electrically connected as an external terminal to a base substrate.

Yet still another example of the external terminals of the infrared ray sensor package 17 is illustrated in FIG. 1E. Conductive terminals 13d are formed on the surface of the base substrate 2 that is opposite to the surface on which the infrared ray sensor element 1 is mounted. The conductive terminals 13d are electrically connected to the infrared ray sensor element 1 and the base substrate 2. The external terminals of the infrared ray sensor package 17 as illustrated in FIG. 1E comprise a flexible circuit board 14 electrically connected to the conductive terminals 13d. The reference numeral 15 denotes a terminal of the flexible circuit board 14.

The external terminals of the infrared ray sensor package 17 in other embodiments of the present invention, which will be described later, may also have various forms. A number of variations are feasible in combination with those embodiments. Many drawings will be needed to explain all of such variations. Therefore, in second and subsequent embodiments of the present invention, the external terminals of the infrared ray sensor package 17 are omitted from the illustration.

In the first embodiment thus configured, unlike the conventional infrared ray sensor package 141 shown in FIG. 8B in which the infrared ray sensor element 121 and the getter 151 are juxtaposed on the lower housing 111, the getter 6a is mounted within the gap 9 formed between the infrared ray sensor element 1 and the base substrate 2 with the spacer material 8. In the conventional infrared ray sensor package 141 shown in FIG. 8B, a separate space for mounting the getter 151 is required in addition to a space within which the infrared ray sensor element 121 is mounted. However, according to the first embodiment, no separate space for mounting the getter 6a is required in addition to a space within which the infrared ray sensor element 1 is mounted. Accordingly, the size of the infrared ray sensor package 17 can be reduced close to the size of an outer shape of the infrared ray sensor element 1. Thus, the infrared ray sensor package 17 can be miniaturized.

Second Embodiment

Next, a second embodiment of the present invention will be described below with reference to FIG. 2. The second embodiment only differs from the aforementioned first embodiment in some points as described below. The following description focuses on the differences between the first embodiment and the second embodiment.

Figure 2:
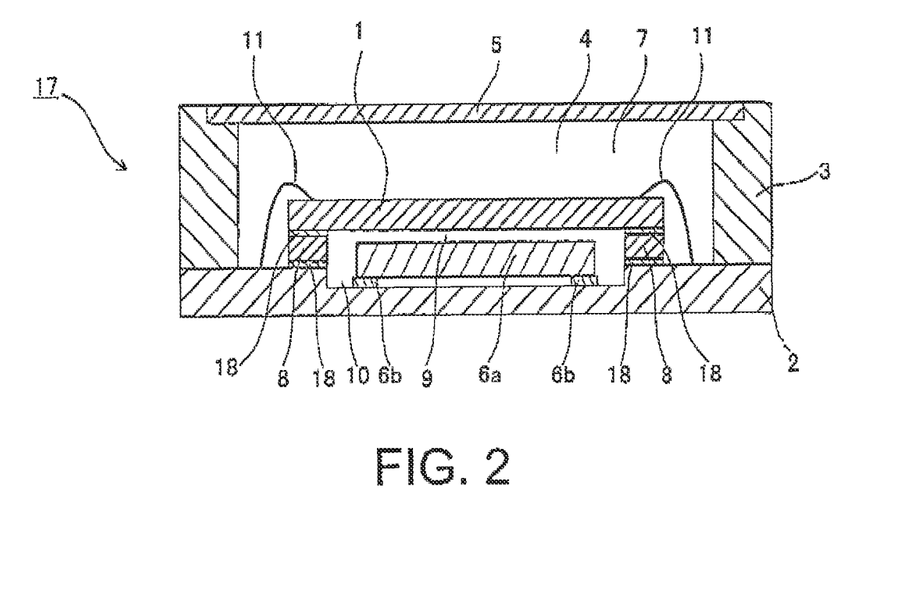
FIG. 2 is a cross-sectional view schematically showing a basic structure of an infrared ray sensor package according to a second embodiment of the present invention.

In the second embodiment, unlike the first embodiment, as shown in FIG. 2, a cavity 10 is formed in an upper surface of the base substrate 2. The cavity 10 is located below the infrared ray sensor element 1. The getter 6a is mounted on the bottom of the cavity 10. The infrared ray sensor element 1 is arranged so as to extend across the cavity 10.

In the second embodiment thus configured, the cavity 10 is formed in part of the base substrate 2 and located below the infrared ray sensor element 1. The getter 6a is mounted in the cavity 10. Therefore, the gap 9 formed between the infrared ray sensor element 1 and the base substrate 2 is widened in the height direction (a direction perpendicular to the base substrate 2) as compared to the first embodiment. Accordingly, the getter 6a being mounted can be increased in thickness and surface area. As a result, the getter 6a can have a wider range of choices of materials.

Third Embodiment

Next, a third embodiment of the present invention will be described below with reference to FIG. 3. The third embodiment only differs from the aforementioned second embodiment in some points as described below. The following description focuses on the differences between the second embodiment and the third embodiment.

Figure 3:
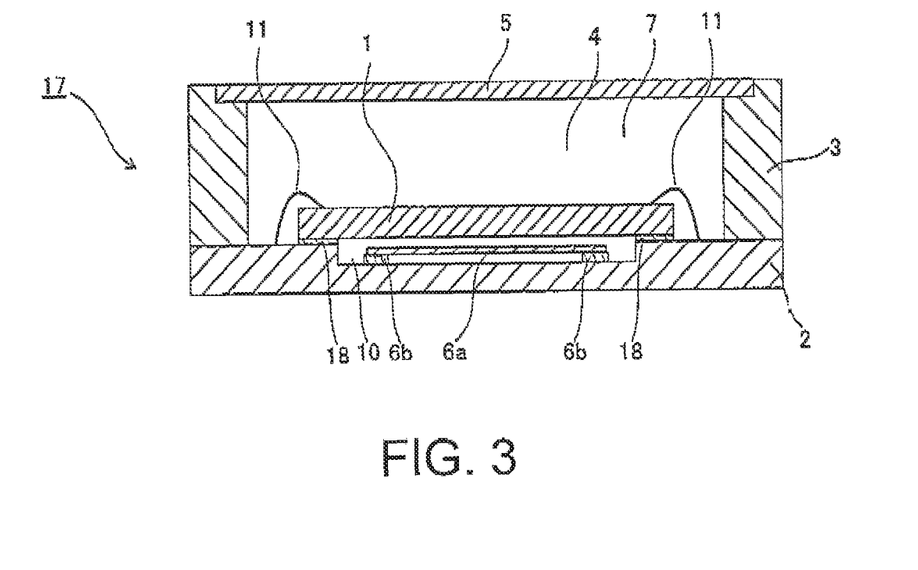
FIG. 3 is a cross-sectional view schematically showing a basic structure of an infrared ray sensor package according to a third embodiment of the present invention.

In the third embodiment, as shown in FIG. 3, the spacer material 8 used in the second embodiment is eliminated. The infrared ray sensor element 1 is mounted directly on the base substrate 2 with only the adhesive agent 18 being interposed between the infrared ray sensor element 1 and the base substrate 2.

In the third embodiment thus configured, the getter 6a is made so thin that the getter 6a can be mounted within the cavity 10. Furthermore, the spacer material 8 is eliminated. Thus, the infrared ray sensor package 17 can be made thinner than the infrared ray sensor package 17 of the second embodiment of the present invention.

Fourth Embodiment

Next, a fourth embodiment of the present invention will be described below with reference to FIGS. 4A to 4C. The fourth embodiment only differs from the aforementioned first to third embodiments in some points as described below. The following description focuses on the differences between the first to third embodiments and the fourth embodiment.

Figure 4A:
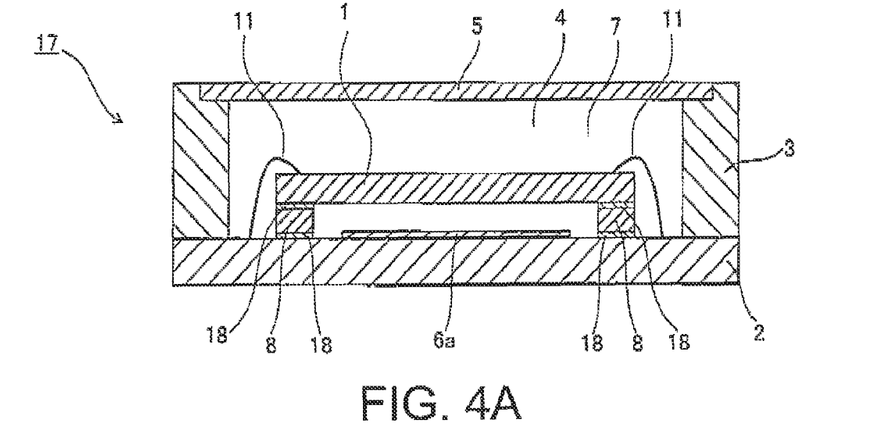
FIG. 4A is a cross-sectional view showing a structure of an infrared ray sensor package according to fourth and fifth embodiments of the present invention.
Figure 4B:
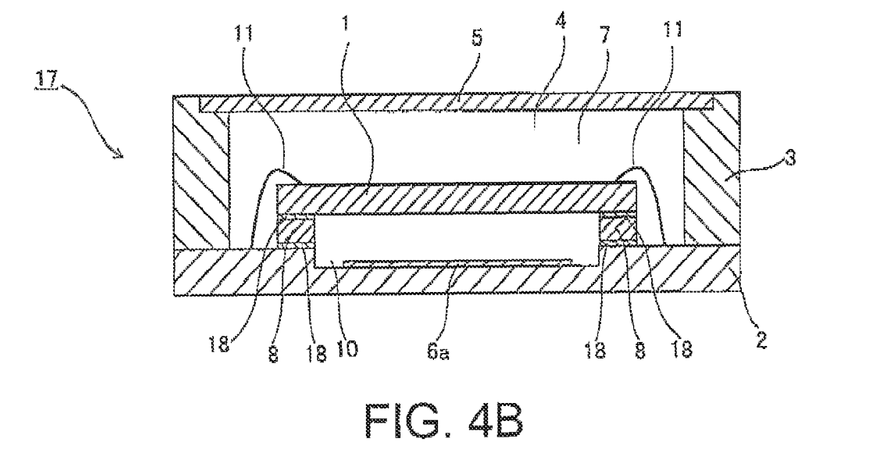
FIG. 4B is a cross-sectional view showing a structure of a variation of the infrared ray sensor package according to the fourth and fifth embodiments of the present invention.
Figure 4C:
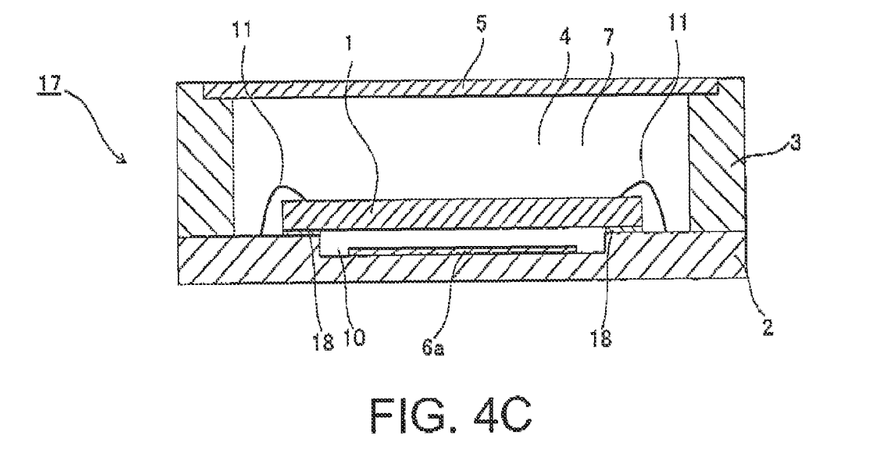
FIG. 4C is a cross-sectional view showing a structure of another variation of the infrared ray sensor package according to the fourth and fifth embodiments of the present invention.

First, an example illustrated in FIG. 4A corresponds to the first embodiment, an example illustrated in FIG. 4B corresponds to the second embodiment, and an example illustrated in FIG. 4C corresponds to the third embodiment. Each of those examples illustrated in FIGS. 4A to 4C differs from the first to third embodiments in that the getter 6a is formed into a thin film. In FIGS. 4A to 4C, the terminals 6b formed on the base substrate 2 and electrically connected to the getter 6a are omitted from the illustration.

Generally, the getter 6a mounted within the interior of the package in which the infrared ray sensor element 1 is vacuum-sealed is a bulky solid rather than a thin film. The getter 6a is electrically connected to the base substrate 2 by spot welding or the like.

Meanwhile, if a thin film of the getter 6a is used as in the fourth embodiment of the present invention, a number of base substrates 2 may be set within an apparatus for forming a thin film of the getter 6a so that a plurality of structures in which the base substrate 2 and the thin film of the getter 6a are integrated with each other can collectively produced. Therefore, the mass production efficiency can be increased so that the manufacturing cost of a package can be reduced.

Additionally, in the examples illustrated in FIGS. 4A and 4B, since the getter 6a is formed into a thin film, the distance between an upper surface of the getter 6a and a lower surface of the infrared ray sensor element 1 is increased. Therefore, the spacer material 8 can be reduced in thickness so that the cost for the spacer material 8 can be reduced. Furthermore, the thickness of the infrared ray sensor package 17 can also be reduced.

Furthermore, in the examples illustrated in FIGS. 4B and 4C, since the getter 6a is formed into a thin film, the distance between an upper surface of the getter 6a and a lower surface of the infrared ray sensor element 1 is increased. Therefore, the depth of the cavity 10 formed in the base substrate 2 can be decreased so that the processing cost of the base substrate 2 can be reduced. Furthermore, since the cavity 10 can be made shallow, the thickness of a portion of the base substrate 2 that is located below the cavity 10 can be increased so that the strength of the base substrate 2 is enhanced. Therefore, the infrared ray sensor package 17 can have a higher reliability.

Moreover, since the getter 6a is formed into a thin film, a plurality of getters 6a can collectively be formed on a plurality of base substrates 2. Thus, it is not necessary to manually connect each one of the getters 6a electrically to an electrode of the corresponding base substrate 2 in one package by using spot welding. Therefore, the mass production efficiency of the infrared ray sensor packages 17 can be increased. Accordingly, the manufacturing cost of the infrared ray sensor package 17 can further be reduced.

Fifth Embodiment

Next, a fifth embodiment of the present invention will be described below. The fifth embodiment only differs from the aforementioned fourth embodiment in some points as described below. The following description focuses on the differences between the fifth embodiment and the fourth embodiment.

The infrared ray sensor package 17 according to the fifth embodiment of the present invention has a basic structure with the same cross-section as that of the fourth embodiment of the present invention illustrated in FIGS. 4A to 4C.

The infrared ray sensor package 17 according to the fifth embodiment of the present invention is characterized in that the thin film of the getter 6a is formed of a material that can be activated by heating at 300° C. or less in the infrared ray sensor package 17 according to the fourth embodiment of the present invention.

The fifth embodiment of the present invention is similar to the fourth embodiment of the present invention but differs from the fourth embodiment in that the thin film of the getter 6a is formed of a material that can be activated by heating at 300° C. or less.

Generally, a Zr-based material, a Ti-based material, or an alloy containing those materials are used for the getter 6a mounted within the interior of the package in which the infrared ray sensor element 1 is vacuum-sealed. If the getter 6a is formed of such a material, it should be heated to at least about 400° C. and thus activated (so that the getter 6a can adsorb gas molecules drifting in the interior of the package).

Meanwhile, the characteristics of the infrared ray sensor element 1 are deteriorated under an environment of about 300° C. or higher. Therefore, the entire infrared ray sensor package 17 cannot be heated to about 300° C. or higher. Thus, a current is generally supplied to the getter 6a so as to directly heat the getter 6a solely and activate the getter 6a.

In the infrared ray sensor package 17 according to the fifth embodiment of the present invention, since the thin film of the getter 6a is formed of a material that can be activated by heating at 300° C. or less, the getter 6a can be activated by heating (at 300° C. or less) in a conventional process of evacuating the interior of the infrared ray sensor package 17. As a result, a separate process of supplying a current to the getter 6a to activate the getter 6a is not required, so that the manufacturing cost of the infrared ray sensor package 17 can be reduced. Furthermore, terminals 6b electrically connected to the getter 6a, which have heretofore been required, are not required to be formed on the base substrate 2. Therefore, the manufacturing cost of the base substrate 2 can be reduced. Thus, the total manufacturing cost of the infrared ray sensor package 17 can further be reduced.

The material of the getter 6a is not limited to a specific one. For example, the getter 6a may suitably be formed of a thin film material produced by covering a Ca-based inorganic compound having a getter effect primarily for water and carbon dioxide with an organic solvent and resin to form a paste material and drying the paste material at about 150° C. for about 30 minutes.

The getter 6a primarily containing a Ca-based inorganic compound can be activated at about 150° C. (≤300° C.). Therefore, the getter 6a can be activated merely by exposure in an environmental temperature (generally at about 220° C. or less) used in a usual process of evacuating the interior of the infrared ray sensor package 17. Accordingly, a separate process of supplying a current to the getter 6a to heat the getter 6a, which requires a relatively long operation time, becomes unnecessary. Thus, the manufacturing cost of the infrared ray sensor package 17 can be reduced.

Sixth Embodiment

Figure 5:
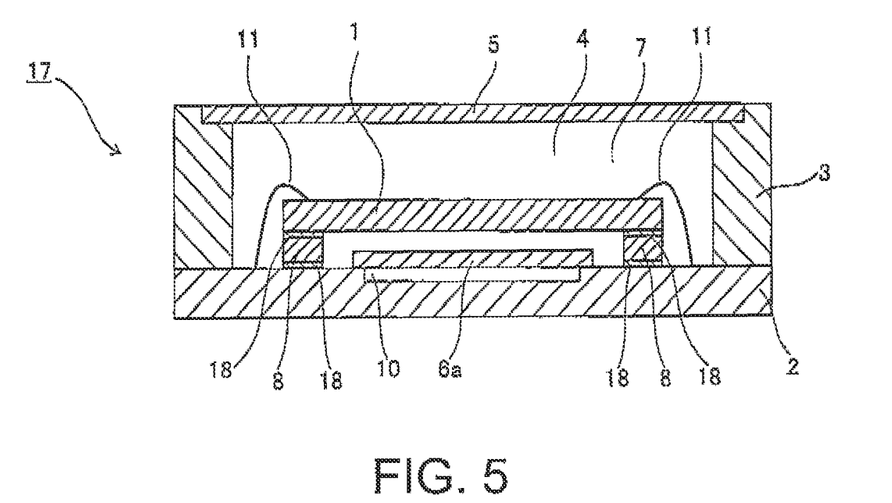
FIG. 5 is a cross-sectional view schematically showing a basic structure of an infrared ray sensor package according to a sixth embodiment of the present invention.

Next, a sixth embodiment of the present invention will be described below with reference to FIG. 5. The sixth embodiment only differs from the aforementioned second embodiment in some points as described below. The following description focuses on the differences between the second embodiment and the sixth embodiment.

In the second embodiment, the getter 6a is disposed on the bottom of the cavity 10. In contrast, in the sixth embodiment, the getter 6a is mounted on the base substrate 2 so as to extend across the cavity 10 as shown in FIG. 5. In FIG. 5, surface terminals 6c formed on the base substrate 2 and electrically connected to the getter 6a are omitted from the illustration.

As the getter 6a has a larger surface area exposed within the internal space of the infrared ray sensor package 17, the getter effects of the getter 6a increases. Therefore, the getter 6a should preferably have a larger surface area exposed within the internal space of the infrared ray sensor package 17 so that it can adsorb more gas molecules drifting within the interior of the infrared ray sensor package 17. From this point of view, in the second embodiment, the block-like terminals 6b are provided on the surface terminals 6c formed on the base substrate 2 so that a lower surface of the getter 6a is not brought into contact with the base substrate 2. The surface terminals 6c have a thickness of about 20 μm or less and are part of a wiring pattern of the base substrate 2. The surface terminals 6c are omitted from the illustration in FIG. 2. Meanwhile, in the sixth embodiment of the present invention shown in FIG. 5, since the getter 6a is mounted so as to extend across the cavity 10 formed in the base substrate 2, a gap is formed between a lower surface of the getter 6a and the base substrate 2. Therefore, no bulky terminals 6b as described above are required. Thus, the getter 6a is electrically connected directly to the surface terminals 6c on the base substrate 2. As a result, the manufacturing step of mounting the bulky terminals 6b on the base substrate 2 becomes unnecessary. Therefore, the manufacturing cost of the infrared ray sensor package 17 can be reduced as compared to the infrared ray sensor package 17 according to the second embodiment of the present invention.

Seventh Embodiment

Figure 6:
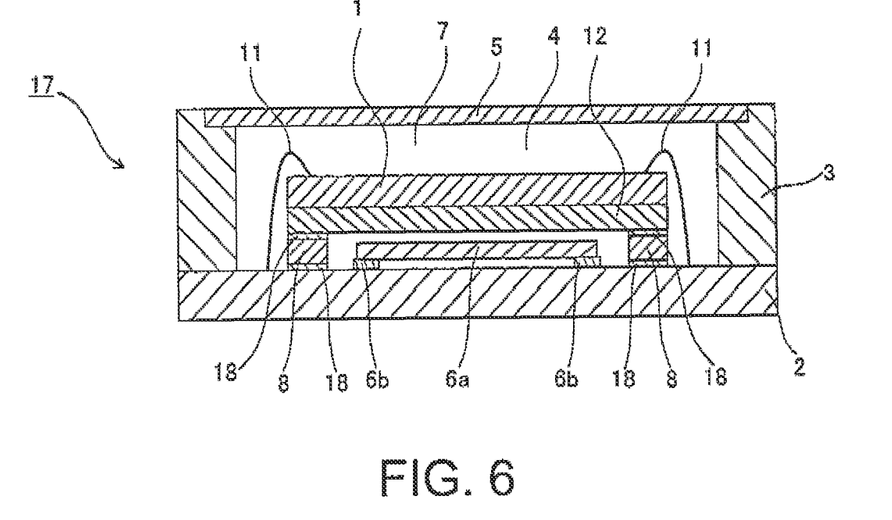
FIG. 6 is a cross-sectional view schematically showing a basic structure of an infrared ray sensor package according to a seventh embodiment of the present invention.

Next, a seventh embodiment of the present invention will be described below with reference to FIG. 6. The seventh embodiment only differs from the aforementioned first embodiment in some points as described below. The following description focuses on the differences between the first embodiment and the sixth embodiment.

In the seventh embodiment, a platelike element (heat shielding member) 12 is mounted on a surface of the infrared ray sensor element 1 that faces the getter 6a so that heat radiated from the getter 6a is prevented from being transferred directly to the infrared ray sensor element 1 when the getter 6a is heated. In the seventh embodiment, the platelike element 12 is fixed onto the spacer material 8, and the getter 6a is fixed to the platelike element 12.

The material of the platelike element 12 is not limited to a specific one. Nevertheless, it is preferable to use, as the material of the platelike element 12, a material having a high heat resistance temperature and a low heat conductivity. For example, heat-resisting glass or a metal plate of an alloy containing Ni with a relatively low heat conductivity, such as Alloy 42 or Kovar, is suitable for the platelike element 12. Since a glass material or an alloy material containing Ni hardly emits a gas by itself, there is almost no risk that the degree of vacuum would be deteriorated in the long term. Therefore, the infrared ray sensor package 17 can exhibit high performance with high reliability. Furthermore, a heater may be provided for holding the infrared ray sensor element 1 at a constant temperature to improve the performance of the infrared ray sensor package 17 while such a heater has not been described or illustrated in the drawings. Such a heater may be used as the aforementioned platelike element 12. In such a case, the heater can also serve to block radiant heat generated upon heating the getter 6a. In other words, a separate platelike element is not required for blocking the radiant heat. Therefore, the manufacturing cost of the infrared ray sensor package 17 can be reduced. A heater is formed of a heat-resisting material by nature because it is used to increase an object to a high temperature. Thus, the heater is not broken by a temperature rise caused when the getter 6a is heated (maximum temperature: about 400° C. to 500° C.). The heater preferably includes a conductor, as a heating element, covered with ceramics such as alumina or silicon nitride.

When such a heater is used as the platelike element 12, i.e., when the infrared ray sensor element 1 is heated by the heater so that the infrared ray sensor element 1 is held at a constant temperature, it is preferable to use a glass material as the spacer material 8. Generally, a glass material has a very low heat conductivity. Therefore, heat generated by supplying a current to the heater is unlikely to be transferred to the entire infrared ray sensor package 17 via the spacer material 8. Accordingly, only the infrared ray sensor element 1 can be heated efficiently. As a result, a current to be supplied to the heater can be lessened. Thus, the electric power consumption of the infrared ray sensor package 17 can be reduced. Such a glass material is not limited to a specific one. Nevertheless, it is preferable to use, as the glass material, borosilicate glass primarily containing $Na_2O$, $B_2O_3$, and $SiO_2$, soda-lime glass primarily containing $Na_2O$, CaO, and $SiO_2$, quartz glass of $SiO_2$, or the like. Among others, borosilicate glass is suitable for such a glass material because it has a low coefficient of thermal expansion and excellent durability in a temperature cycling test or a thermal-shock test.

A current is supplied to the external terminals of the infrared ray sensor package 17 (not shown) so as to heat and activate the getter 6a. Generally, the getter 6a should be heated at about 400° C. or higher for about 15 minutes to about 30 minutes. At that time, radiant heat is transferred from the getter 6a toward other components of the infrared ray sensor package 17. According to the seventh embodiment of the present invention, the platelike element 12 is mounted below the infrared ray sensor element 1 to prevent the radiant heat from being transferred directly to the infrared ray sensor element 1. Thus, the temperature of the infrared ray sensor element 1 is prevented from increasing even though the getter 6a is heated. Therefore, the characteristics of the infrared ray sensor element 1, such as the sensitivity and the image quality, are prevented from being deteriorated.

The configuration in which the platelike element 12 is mounted below the infrared ray sensor element 1 so that heat radiated from the getter 6a is prevented from being transferred directly to the infrared ray sensor element 1 when the getter 6a is heated may be applied to the second to sixth embodiments illustrated in FIGS. 2 to 5. In those cases, the same advantages can be obtained as a matter of course, the details of which are omitted herein.

Eighth Embodiment

Figure 7A:
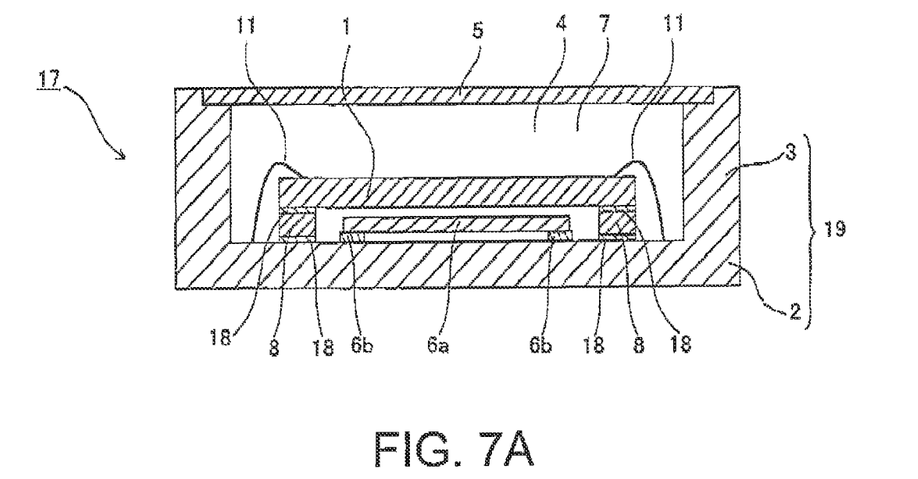
FIG. 7A is a cross-sectional view showing a structure of an infrared ray sensor package according to an eighth embodiment of the present invention.
Figure 7B:
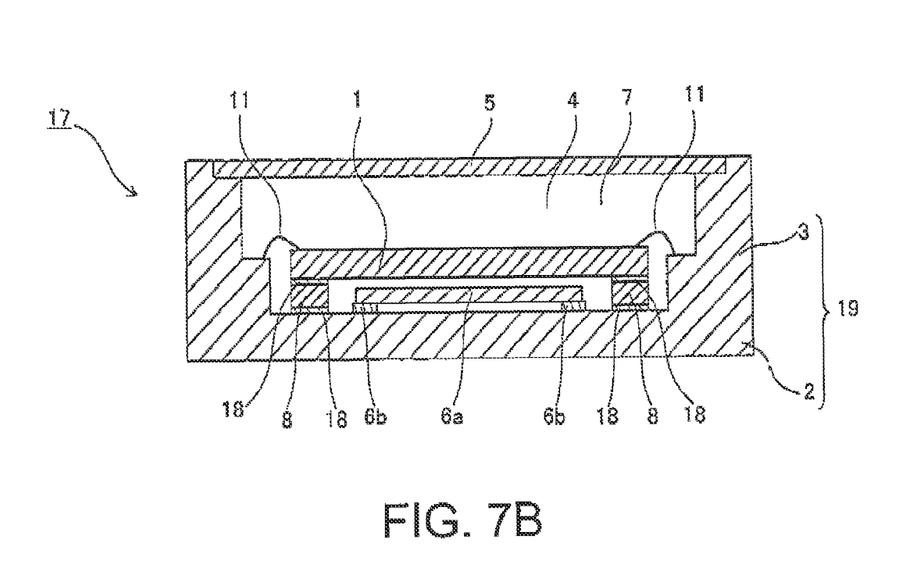
FIG. 7B is a cross-sectional view showing a structure of a variation of the infrared ray sensor package according to the eighth embodiment of the present invention.

Next, an eighth embodiment of the present invention will be described below with reference to FIGS. 7A and 7B. The eighth embodiment only differs from the aforementioned first embodiment in some points as described below. The following description focuses on the differences between the first embodiment and the eighth embodiment.

In the first embodiment, the base substrate 2 and the housing 3 are separately provided. In contrast, according to the eighth embodiment as shown in FIGS. 7A and 7B, the base substrate 2 and the housing 3 are integrated with each other. In the following description, the member into which the base substrate 2 and the housing 3 are integrated is referred to an integrated base substrate 19. The example illustrated in FIG. 7B differs from the example illustrated in FIG. 7A only in that a cavity is formed in the integrated base substrate 19.

In the eighth embodiment, since the base substrate 2 and the housing 3 are integrated with each other, the infrared ray sensor package 17 can be vacuum-sealed by joining the infrared ray transmission window 5 directly to the integrated base substrate 19, into which the base substrate 2 and the housing 3 have been integrated, under vacuum.

In the infrared ray sensor package 17 according to the first embodiment, the infrared ray sensor package 17 is vacuum-sealed at two portions, i.e., between the base substrate 2 and the housing 3 and between the housing 3 and the infrared ray transmission window 5. In contrast, according to the eighth embodiment, the infrared ray sensor package 17 is vacuum-sealed only at one portion, i.e., between the integrated base substrate 19 and the infrared ray transmission window 5. Therefore, the infrared ray sensor package 17 has a smaller vacuum-sealing region, making it possible to reduce the risk that the degree of vacuum would be deteriorated in the long term because of leakage after completion of the infrared ray sensor package 17. Thus, the infrared ray sensor package 17 can exhibit higher performance with higher reliability.

The configuration in which the base substrate 2 and the housing 3 are integrated with each other may be applied to the second to seventh embodiments illustrated in FIGS. 2 to 6. In those cases, the same advantages can be obtained as a matter of course, the details of which are omitted herein.

Ninth Embodiment

Next, a ninth embodiment of the present invention will be described below.

In the ninth embodiment, which is omitted from the illustration, there is provided an infrared ray sensor module using the small-sized infrared ray sensor package 17 according to the first to eighth embodiments. The infrared ray sensor module includes a driver circuit electrically connected to the infrared ray sensor package 17. Specifically, the infrared ray sensor module can drive the infrared ray sensor as soon as electric power is supplied to the infrared ray sensor module.

As a result, a system using the infrared ray sensor package 17, such as a thermography system, a night surveillance camera, a camera for fire fighting, or a defense camera mounted on a reconnaissance drone, can readily be designed at a low cost and reduced in size.

Tenth Embodiment

Next, a tenth embodiment of the present invention will be described below.

In the tenth embodiment, which is omitted from the illustration, there is provided an electronic device using the small-sized infrared ray sensor package 17 according to the first embodiment to eighth embodiments or the infrared ray sensor module according to the ninth embodiment. Thus, the electronic device, such as a thermography system, a night surveillance camera, a camera for fire fighting, or a defense camera mounted on a reconnaissance drone, can be made small in size with high performance at a low cost because the infrared ray sensor package or the infrared ray sensor module that has a size smaller than a conventional one is mounted on the electronic device.

Although some embodiments of the present invention have been described, the present invention is not limited to the aforementioned embodiments. As a matter of course, various changes may be made in the above embodiments without departing from the scope of the present invention. The features of the aforementioned embodiments may be combined with each other in a proper manner as long as such combination does not arise any trouble.

What is claimed is:

1. An infrared ray sensor package comprising:
   an infrared ray sensor element;
   a base substrate portion electrically connected to the infrared ray sensor element;
   a housing portion surrounding the infrared ray sensor element;
   an infrared ray transmission window, the infrared ray sensor element being vacuum-sealed in a space surrounded by the base substrate portion, the housing portion, and the infrared ray transmission window;
   a getter arranged in a gap between the infrared ray sensor element and the base substrate portion, wherein a cavity is formed between the getter and the base substrate; and
   a heat shielding member disposed between the infrared ray sensor element and the getter, the heat shielding member comprising a heater for heating the infrared ray sensor element, the heater being provided apart from the getter.

2. The infrared ray sensor package as recited in claim 1, wherein the heat shielding member is fixed to a surface of the infrared ray sensor element that faces the getter.

3. The infrared ray sensor package as recited in claim 1, wherein the base substrate portion has a cavity formed in a surface thereof that faces the infrared ray sensor element, and
   the getter is mounted on the surface of the base substrate portion so as to extend across the cavity of the base substrate portion.

4. The infrared ray sensor package as recited in claim 1, wherein the getter is in a form of a thin film.

5. The infrared ray sensor package as recited in claim 4, wherein the getter is made of a material that is activated by heating at 300° C. or less.

6. The infrared ray sensor package as recited in claim 1,
   further comprising a spacer disposed between the infrared ray sensor element and the base substrate portion to form the gap between the infrared ray sensor element and the base substrate portion,
   wherein the spacer is made of a glass material.

7. An infrared ray sensor module comprising:
   the infrared ray sensor package as recited in claim 1; and
   a driver circuit electrically connected to the infrared ray sensor package, the driver circuit being operable to drive the infrared ray sensor package.

8. An electronic device comprising the infrared ray sensor package as recited in claim 1.

9. An electronic device comprising the infrared ray sensor module as recited in claim 7.

10. An infrared ray sensor package comprising:
    an infrared ray sensor element;
    a base substrate portion electrically connected to the infrared ray sensor element;
    a housing portion surrounding the infrared ray sensor element;
    an infrared ray transmission window, the infrared ray sensor element being vacuum-sealed in a space surrounded by the base substrate portion, the housing portion, and the infrared ray transmission window;
    a getter arranged in a gap between the infrared ray sensor element and the base substrate portion, the base substrate portion having a cavity formed in a surface thereof that faces the infrared ray sensor element, the getter being mounted on the surface of the base substrate portion so as to extend across the cavity of the base substrate portion, and
    a heat shielding member disposed between the infrared ray sensor element and the getter,
    wherein, the heat shielding member comprises a heater for heating the infrared ray sensor element, the heater being provided apart from the getter.

11. The infrared ray sensor package as recited in claim 10, wherein the getter is in a form of a thin film.

12. The infrared ray sensor package as recited in claim 11, wherein the getter is made of a material that is activated by heating at 300° C. or less.

13. The infrared ray sensor package as recited in claim 10, further comprising a spacer disposed between the infrared ray sensor element and the base substrate portion to form the gap between the infrared ray sensor element and the base substrate portion,
wherein the spacer is made of a glass material.

14. A infrared ray sensor module comprising:
the infrared ray sensor package as recited in claim 10; and
a driver circuit electrically connected to the infrared ray sensor package, the driver circuit being operable to drive the infrared ray sensor package.

15. An electronic device comprising the infrared ray sensor package as recited in claim 10.

16. An electronic device comprising the infrared ray sensor module as recited in claim 14.

17. An infrared ray sensor package comprising:
an infrared ray sensor element;
a base substrate portion electrically connected to the infrared ray sensor element;
a housing portion surrounding the infrared ray sensor element;
an infrared ray transmission window, the infrared ray sensor element being vacuum-sealed in a space surrounded by the base substrate portion, the housing portion, and the infrared ray transmission window;
a getter arranged in a gap between the infrared ray sensor element and the base substrate portion; and
a heat shielding member disposed between the infrared ray sensor element and the getter,
wherein, the heat shielding member is fixed to a surface of the infrared ray sensor element that faces the getter, and the heat shielding member comprises a heater for heating the infrared ray sensor element, the heater being provided apart from the getter.

* * * * *